United States Patent
Chen

(10) Patent No.: US 9,449,963 B2
(45) Date of Patent: Sep. 20, 2016

(54) GATE STRUCTURE WITH HARD MASK STRUCTURE FORMED THEREON AND METHOD FOR FORMING THE SAME

(71) Applicant: Taiwan Semiconductor Manufacturing Co., Ltd, Hsin-Chu (TW)

(72) Inventor: Huang-Kui Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 91 days.

(21) Appl. No.: 14/323,507

(22) Filed: Jul. 3, 2014

(65) Prior Publication Data

US 2016/0005731 A1 Jan. 7, 2016

(51) Int. Cl.
| H01L 29/00 | (2006.01) |
| H01L 27/06 | (2006.01) |
| H01L 29/78 | (2006.01) |
| H01L 49/02 | (2006.01) |
| H01L 29/66 | (2006.01) |
| H01L 29/94 | (2006.01) |

(52) U.S. Cl.
CPC ........... *H01L 27/0629* (2013.01); *H01L 28/40* (2013.01); *H01L 29/66181* (2013.01); *H01L 29/66795* (2013.01); *H01L 29/785* (2013.01); *H01L 29/94* (2013.01)

(58) Field of Classification Search
CPC ........... H01L 27/0629; H01L 27/0635; H01L 27/0711; H01L 27/0716; H01L 27/785; H01L 23/5223; H01L 29/66795; H01L 29/785; H01L 29/94; H01L 29/66181; H01L 28/40
See application file for complete search history.

(56) References Cited

U.S. PATENT DOCUMENTS

| 6,037,216 A * | 3/2000 | Liu | H01L 27/10844 257/E21.646 |
| 6,716,690 B1 * | 4/2004 | Wang | H01L 21/26586 257/E21.345 |
| 2010/0038692 A1 * | 2/2010 | Chuang | H01L 27/0629 257/298 |
| 2015/0194433 A1 * | 7/2015 | Ponoth | G11C 17/16 326/38 |

* cited by examiner

*Primary Examiner* — Marc Armand
*Assistant Examiner* — Quovaunda V Jefferson
(74) *Attorney, Agent, or Firm* — Birch, Stewart, Kolasch & Birch, LLP

(57) ABSTRACT

A semiconductor structure and a method for forming the same are provided. The semiconductor structure includes a first capacitor structure. The first capacitor structure includes a fin structure formed over a substrate and a first gate structure formed over the substrate. In addition, a first portion of the first gate structure overlaps with a portion of the fin structure. The first capacitor structure further includes a first hard mask structure formed over the first portion of the first gate structure and a first conductive structure formed on the first hard mask structure over the first portion of the first gate structure. The first capacitor structure further includes a first contact formed on a second portion of the first gate structure. In addition, the first contact is in direct contact with the second portion of the first gate structure.

20 Claims, 17 Drawing Sheets

GATE STRUCTURE WITH HARD MASK STRUCTURE FORMED THEREON AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

As technology nodes shrink, in some integrated circuit (IC) designs, there has been a desire to replace the typically polysilicon gate with a metal gate to improve device performance with the decreased feature sizes. One process of forming the metal gate is called a "gate last" process. In a "gate last" process, the metal gate is fabricated last, which allows for a reduced number of subsequent processes.

However, although existing "gate last" processes have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A-1 to FIG. 2K-3 are cross-sectional representations of various stages of forming the semiconductor structure taken along lines A-A', B-B', and C-C' shown in FIG. 1 in accordance with some embodiments.

FIG. 3 is a perspective view of the semiconductor structure shown in FIG. 1 and FIG. 2A-1 to FIG. 2K-3 in accordance with some embodiments.

FIG. 4A-1 to FIG. 4A-3 are cross-sectional representations of the semiconductor structure taken along lines A-A', B-B', and C-C' shown in FIG. 1 in accordance with some embodiments.

DETAILED DESCRIPTION

Figure 1:
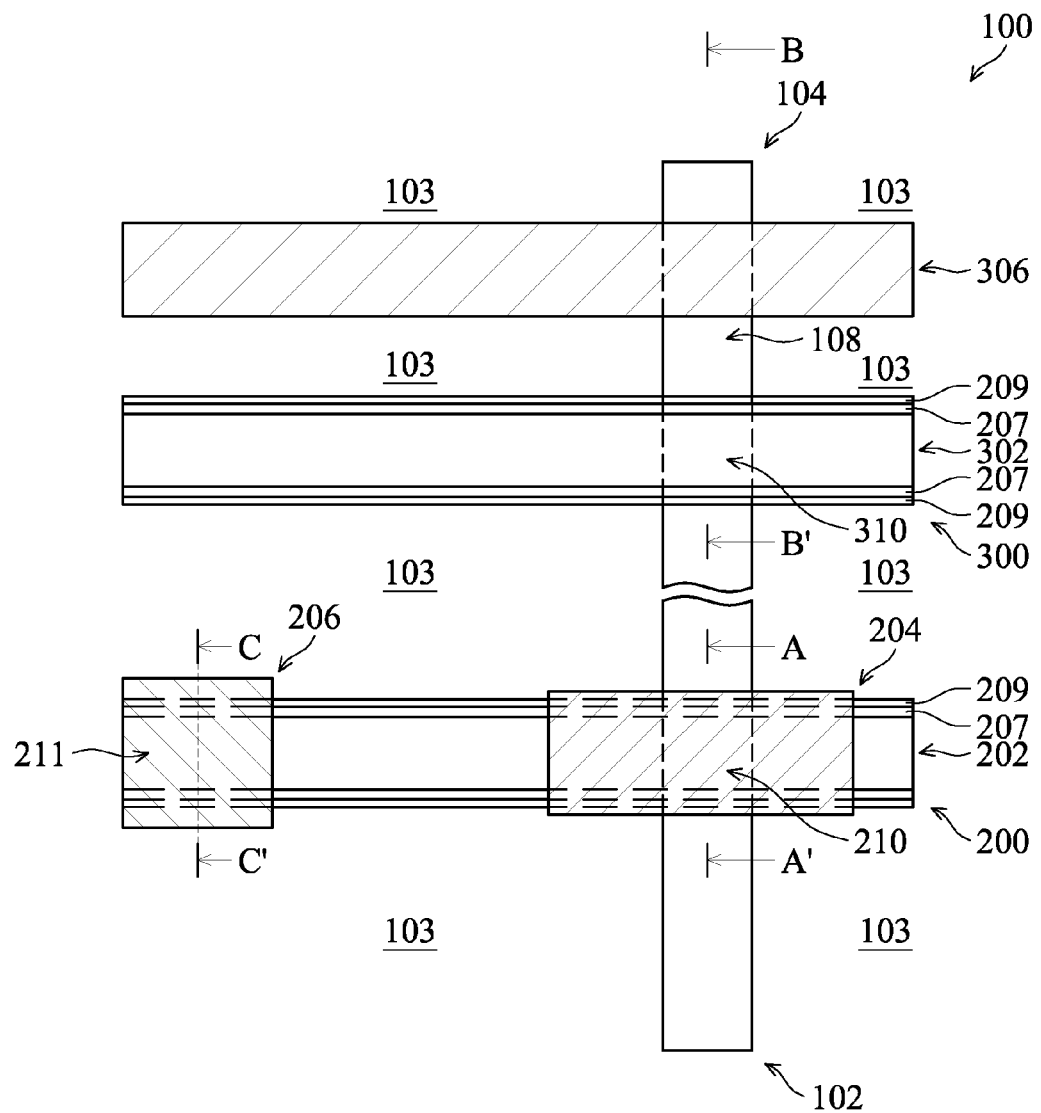
FIG. 1 is a top view representation of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor structure are provided in accordance with some embodiments of the disclosure. The semiconductor structure may include a capacitor structure, and the formation of the capacitor structure may implemented in the process used to form a transistor structure. FIG. 1 is a top view representation of a semiconductor structure 100 in accordance with some embodiments.

Semiconductor structure 100 includes a capacitor structure 200 and a transistor structure 300 formed over a substrate 102 in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, and/or conductive features. Furthermore, substrate 102 may further include single or multiple material layers to be patterned. For example, the material layers may include a silicon layer, a dielectric layer, and/or a doped poly-silicon layer.

In some embodiments, substrate 102 includes a fin structure 104, such as a silicon (Si) fin structure, extending from substrate 102. Fin structure 104 may be formed by any applicable processes, such as lithography and etching processes. For example, fin structure 104 may be formed by forming a photoresist layer (resist) overlying substrate 102, exposing the resist to a pattern, performing a baking process, and developing the resist to form a masking element including the resist. Afterwards, the masking element may be used to form fin structure 104 from substrate 102. Fin structure 104 may be etched by using a reactive ion etch (RIE) and/or other applicable processes.

In some embodiments, substrate 102 further includes isolation features 103. Isolation features 103, such as shallow trench isolation (STI) structures, surround fin structure 104 and isolate fin structure 104 from other fin structures (not shown). Isolation features 103 may be formed by partially filling trenches surrounding fin structure 104 with an insulating material, such as silicon oxide, silicon nitride, silicon oxynitride, other applicable materials, or combinations thereof.

In some embodiments, capacitor structure 200 includes a first gate structure 202 and a first conductive structure 204 formed over a first portion 210 of gate structure 202. Capacitor structure 200 further includes a first contact 206 formed on a second portion 211 of first gate structure 202. In some embodiments, transistor structure 300 is a FinFET transistor structure and includes a second gate structure 302 formed across fin structure 104 over substrate 102. As shown in FIG. 1, a first portion 310 of second gate structure 302 overlaps with a portion of fin structure 104. A second contact 306 is formed on source and drain regions 108 of fin structure 104.

As shown in FIG. 1, first portion 210 of first gate structure 202 also overlaps with a portion of fin structure 104 and is positioned between source and drain regions 108 of fin structure 104 in accordance with some embodiments.

It should be noted that FIG. 1 has been simplified for the sake of clarity to better illustrate the concepts of the present disclosure. Additional features may be added in semiconductor structure 100, and some of the features described below can be replaced or eliminated in other embodiments. For example, additional structures, such as additional fin structures, may be formed between capacitor structure 200 and transistor structure 300. Details of the structure and the method for forming semiconductor structure 100 in accordance with some embodiments are described below.

Figures 1, 2A:
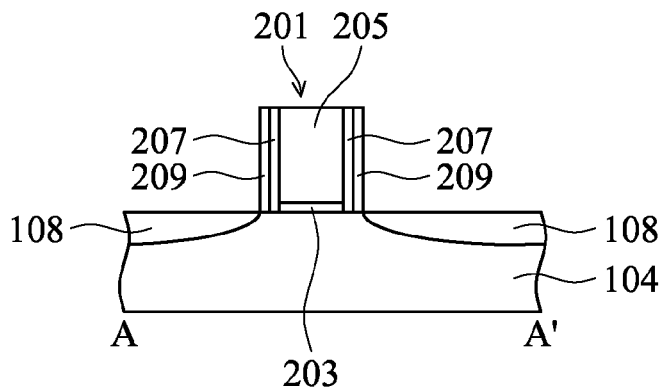
Figures 2, 2A:
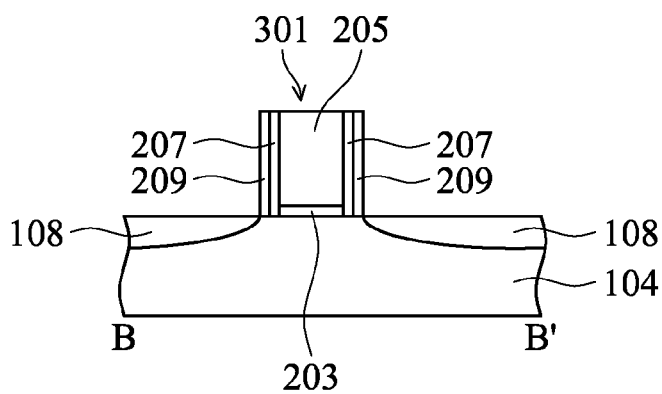
Figures 2, 2A, 3:
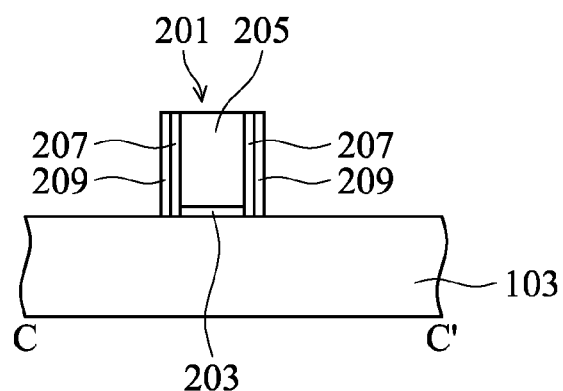
Figures 1, 2B:
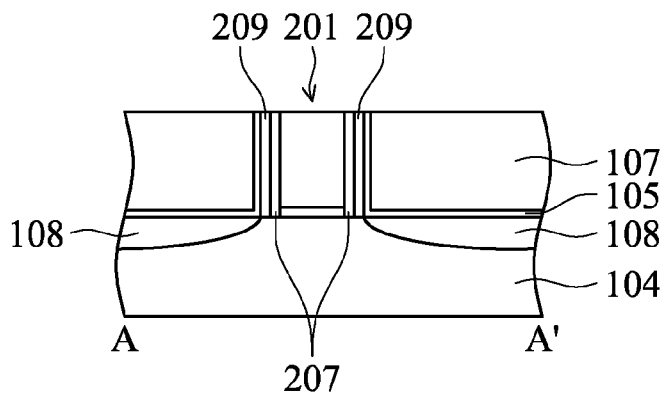
Figures 2, 2B:
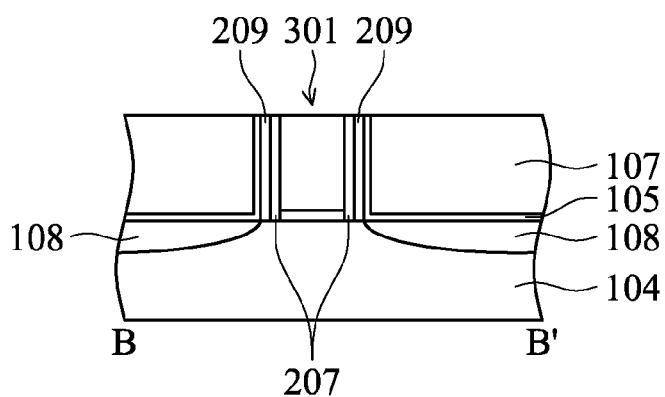
Figures 2, 2B, 3:
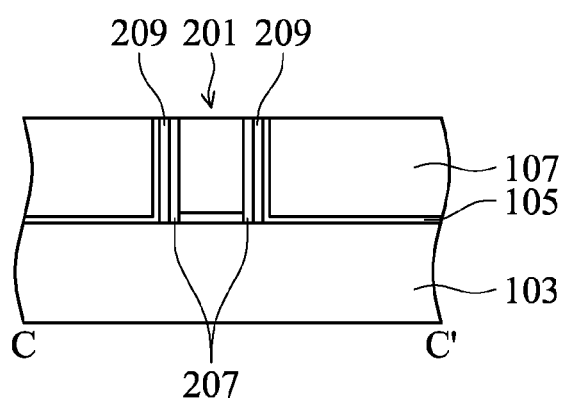
Figures 1, 2C:
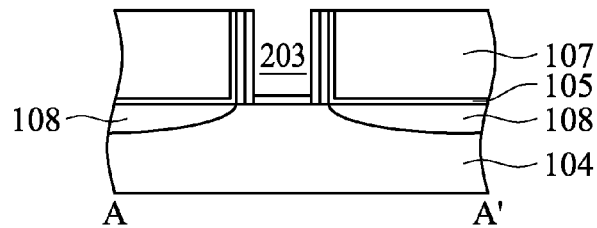
Figures 2, 2C:
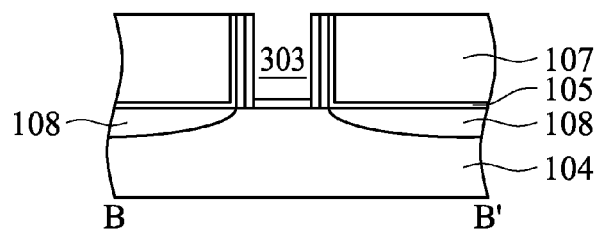
Figures 2, 2C, 3:
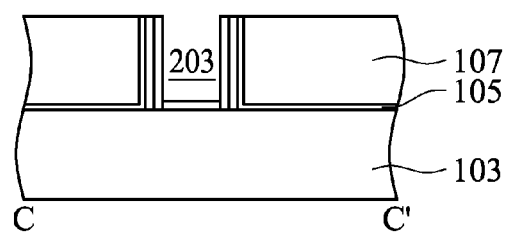
Figures 1, 2D:
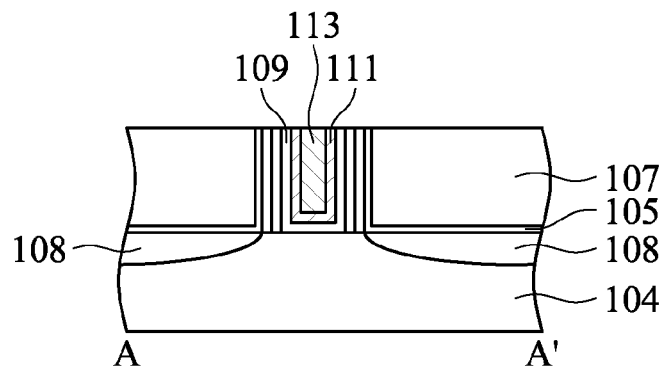
Figures 2, 2D:
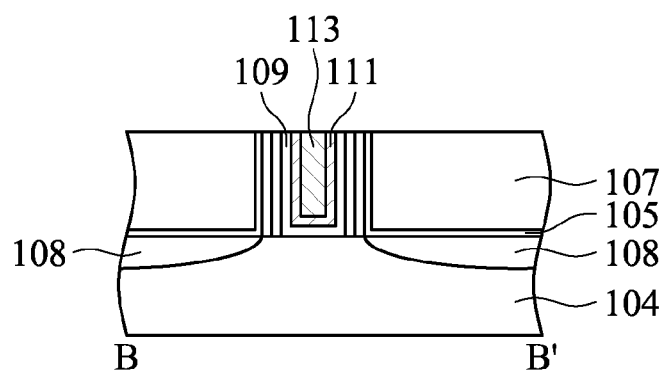
Figures 2, 2D, 3:
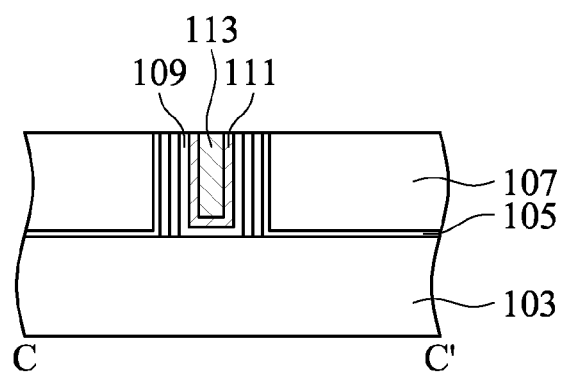
Figure 2:
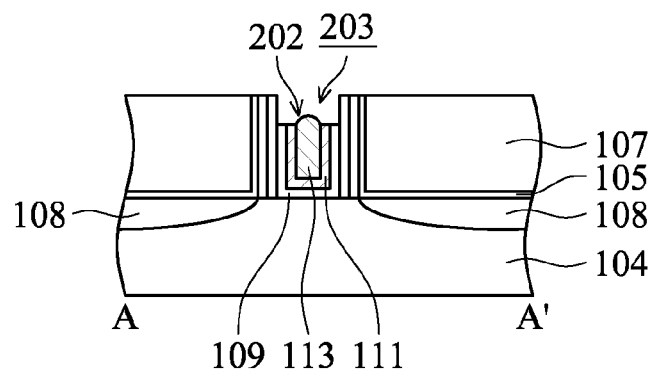
Figure 2:
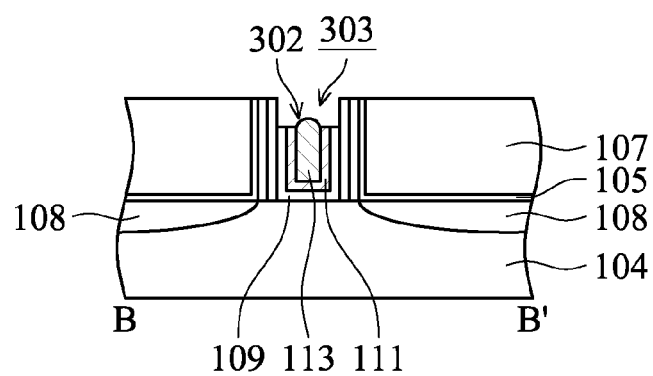
Figure 2:
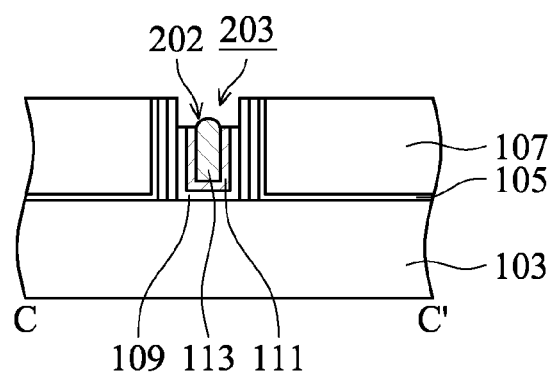
Figure 2:
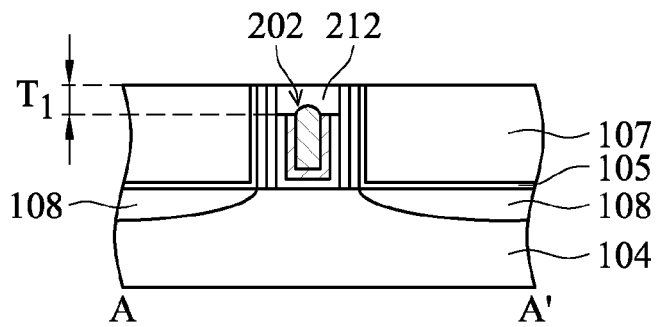
Figure 2:
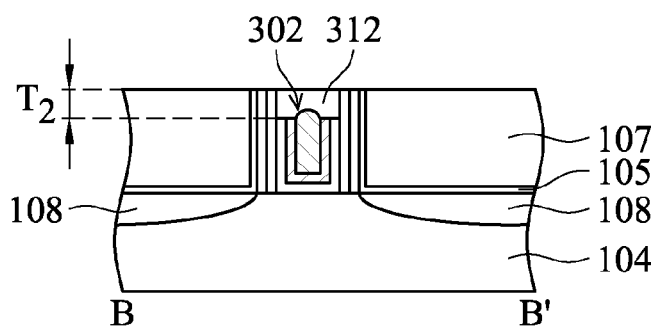
Figure 2:
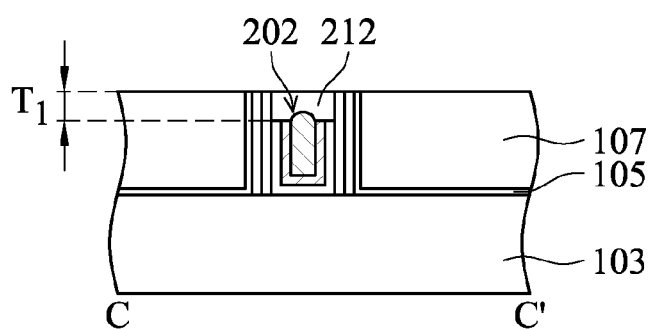
Figures 1, 2G:
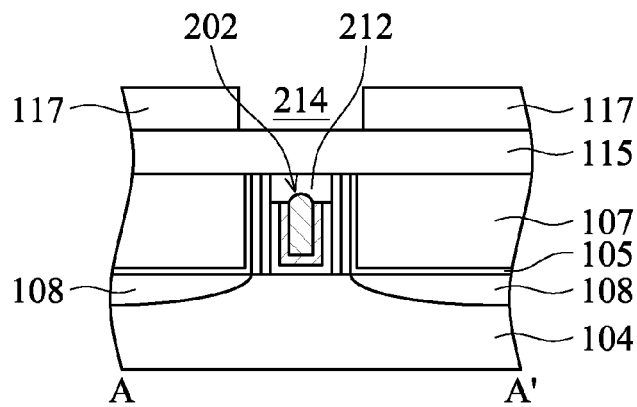
Figures 2, 2G:
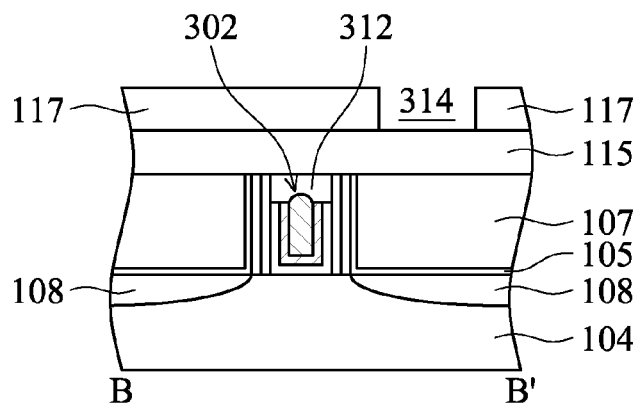
Figures 2, 2G, 3:
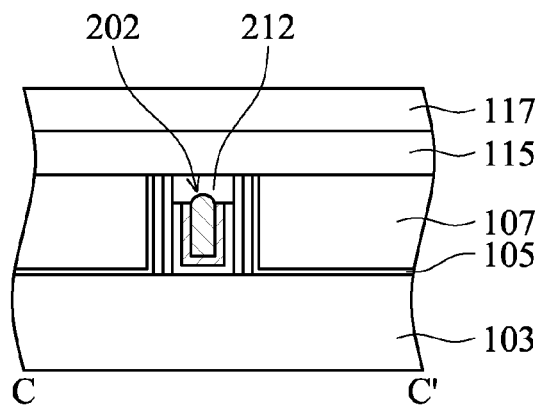
Figures 1, 2H:
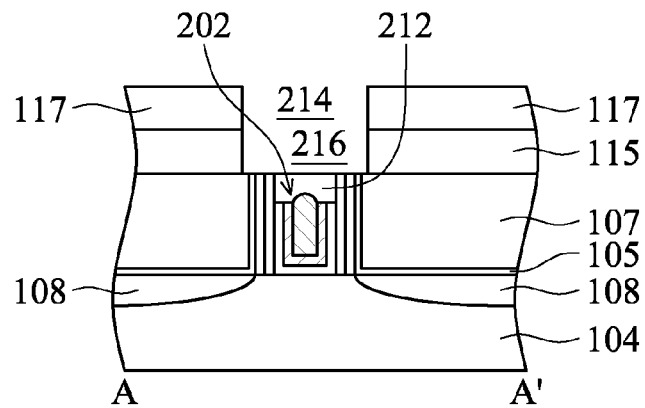
Figures 2, 2H:
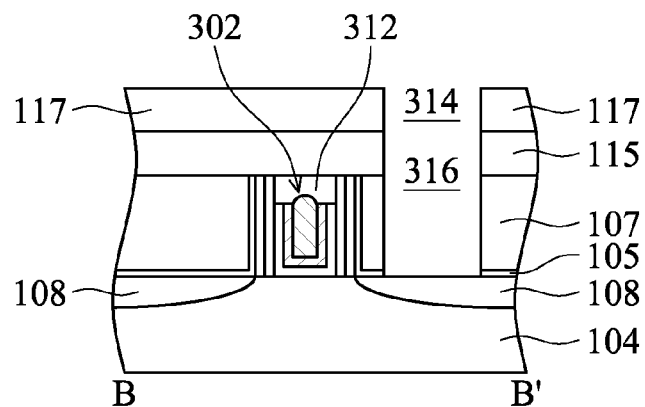
Figures 2, 2H, 3:
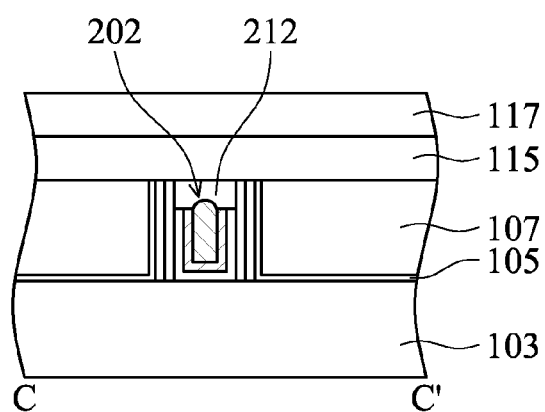
Figure 2:
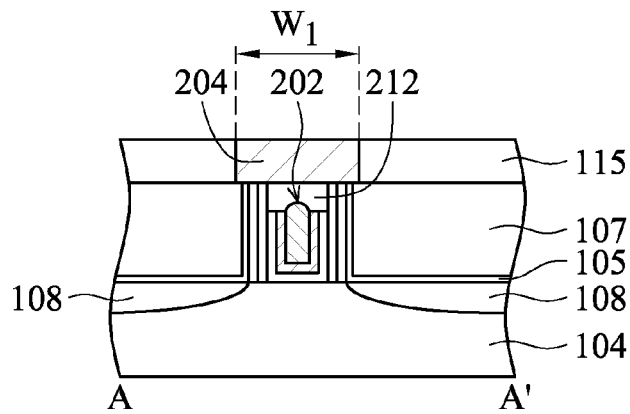
Figure 2:
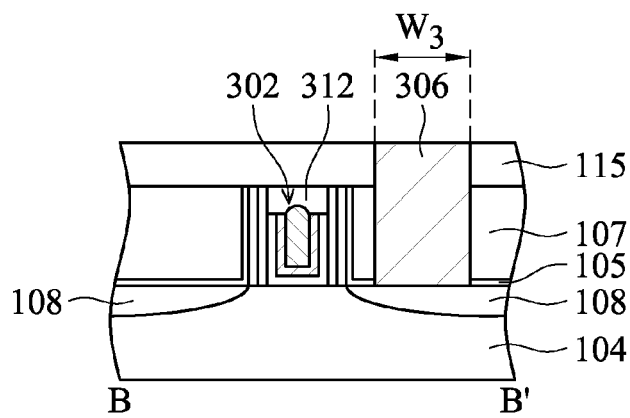
Figure 2:
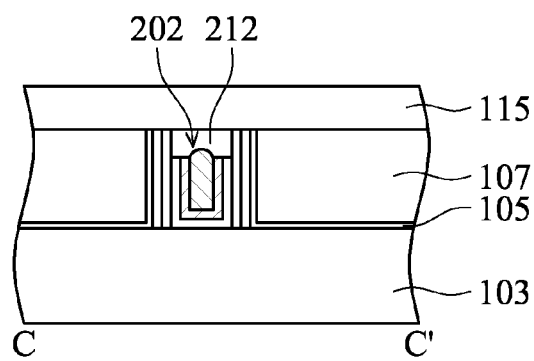
Figure 2:
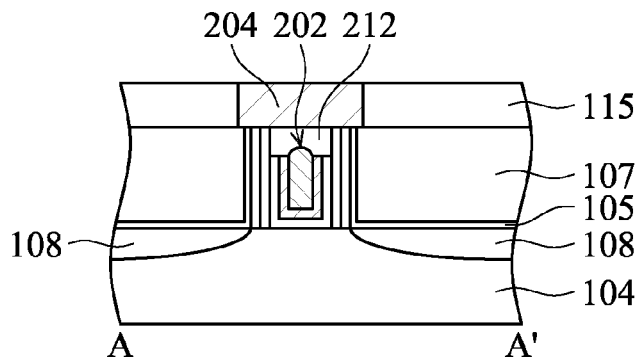
Figure 2:
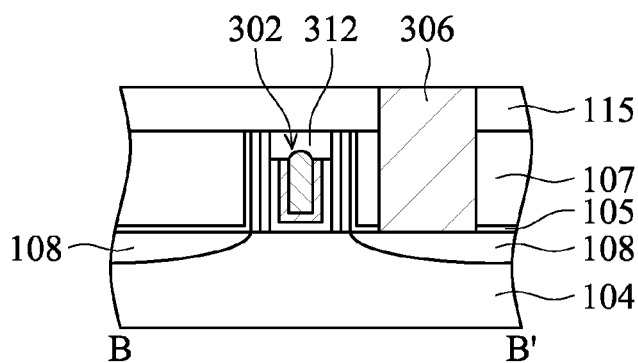
Figure 2:
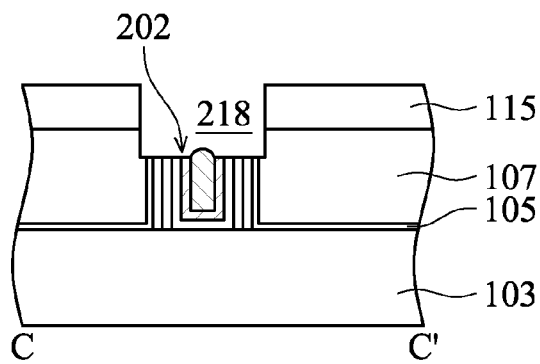
Figures 1, 2K:
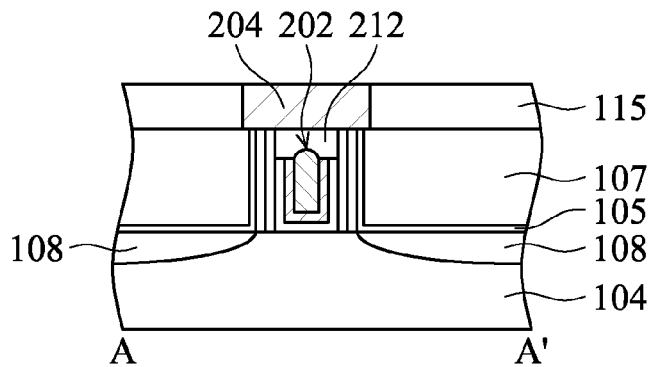
Figures 2, 2K:
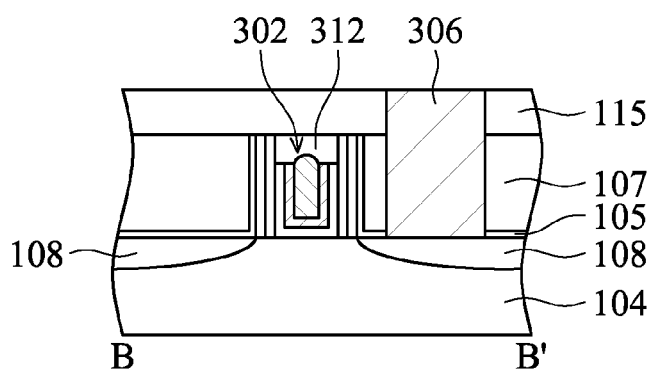
Figures 2, 2K, 3:
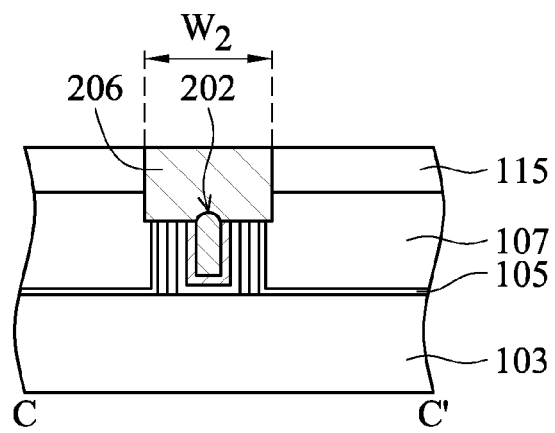
Figure 3:
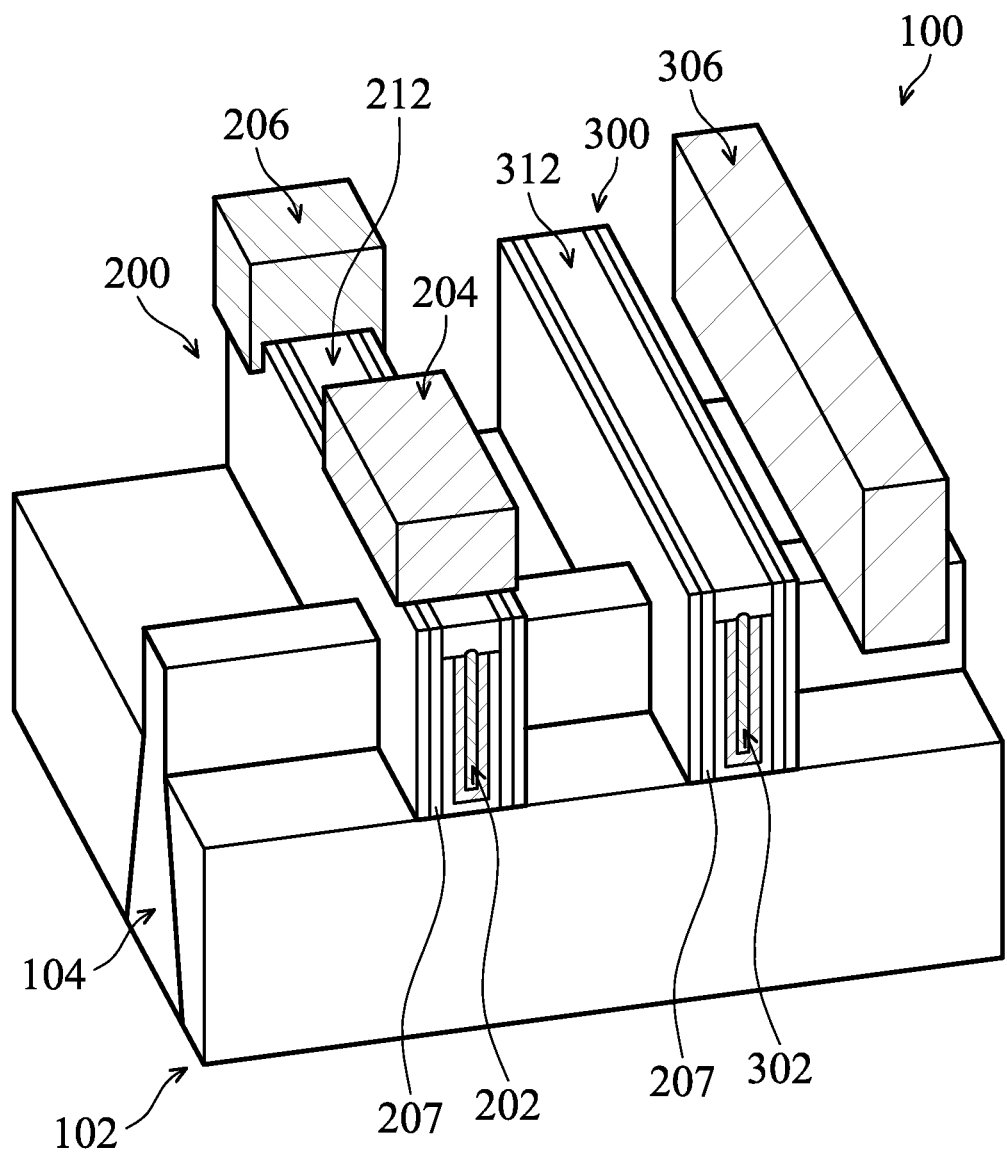

FIG. 2A-1 to FIG. 2K-3 are cross-sectional representations of various stages of forming semiconductor structure 100 taken along lines A-A', B-B', and C-C' shown in FIG. 1 in accordance with some embodiments. More specifically, FIG. 2A-1 to FIG. 2K-1 are cross-sectional representations of various stages of forming semiconductor structure 100 taken along line A-A' shown in FIG. 1 in accordance with some embodiments. FIG. 2A-2 to FIG. 2K-2 are cross-sectional representations of various stages of forming semiconductor structure 100 taken along line B-B' shown in FIG. 1 in accordance with some embodiments. FIG. 2A-3 to FIG. 2K-3 are cross-sectional representations of various stages of forming semiconductor structure 100 taken along line C-C' shown in FIG. 1 in accordance with some embodiments.

A first dummy gate substrate 201 and a second dummy gate structure 301 are formed over substrate 102 in accordance with some embodiments. In some embodiments, first dummy gate structure 201 and second dummy gate structure 301 respectively include a dummy gate dielectric layer 203 and a dummy gate electrode layer 205. In some embodiments, dummy gate dielectric layer 203 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, dummy gate electrode layer 205 is made of polysilicon.

First dummy gate structure 201 and second dummy gate structure 301 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

It should be noted that first dummy gate structure 201 and second dummy gate structure 301 may be adjacent to each other or other structures may be formed between first dummy gate structure 201 and second dummy gate structure 301, and the scope of the disclosure is not intended to be limiting.

After first dummy gate structure 201 and second dummy gate structure 301 are formed on substrate 102, a sealing layer 207 is formed on sidewalls of first dummy gate structure 201 and second dummy gate structure 301, as shown in FIG. 2A-1 to FIG. 2A-3 in accordance with some embodiments. Sealing layer 207 may protect first dummy gate structure 201 and second dummy gate structure 301 from damage or loss during subsequent processing and may also prevent oxidation during subsequent processing. In some embodiments, sealing layer 207 is made of silicon nitride, silicon oxide, silicon oxynitride, silicon carbide, or other applicable dielectric materials. Sealing layer 207 may include a single layer or multiple layers.

Spacers 209 are further formed on sealing layer 207 in accordance with some embodiments. In some embodiments, spacers 209 are made of silicon nitride, silicon oxide, silicon carbide, silicon oxynitride, or other applicable materials. Spacers 209 may be formed by deposition and etching processes.

Next, source/drain (S/D) regions 108 are formed in fin structure 104, as shown in FIGS. 2A-1 and 2A-2. S/D regions 108 may be formed by one or more ion implantation processes, photolithography, diffusion, and/or other applicable processes. The doping species may depend on the type of device being fabricated. In some embodiments, source/drain (S/D) regions 108 are formed by recessing some portions of fin structure 104 and forming epi structures in the recesses of fin structure 104 by an epitaxial (epi) process.

After S/D regions 108 are formed, a contact etch stop layer (CESL) 105 is formed to cover first dummy gate structure 201 and second dummy gate structure 301 over substrate 102, as shown in FIG. 2B-1 to FIG. 2B-3 in accordance with some embodiments. In some embodiments, contact etch stop layer 105 is made of silicon nitride, silicon oxynitride, and/or other applicable materials. Contact etch stop layer 105 may be formed by plasma enhanced CVD, low pressure CVD, ALD, or other applicable processes.

After contact etch stop layer 105 is formed, an inter-layer dielectric (ILD) layer 107 is formed on contact etch stop layer 105 over substrate 102 in accordance with some embodiments. Inter-layer dielectric layer 107 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Inter-layer dielectric layer 128 may be formed by chemical vapor deposition (CVD), physical vapor deposition, (PVD), atomic layer deposition (ALD), spin-on coating, or other applicable processes.

Afterwards, a polishing process is performed to inter-layer dielectric layer 107 in accordance with some embodiments. In some embodiments, inter-layer dielectric layer 107 is planarized by a chemical mechanical polishing (CMP) process until the top surfaces of first dummy gate structure 201 and second dummy gate structure 301 are exposed.

After the polishing process is performed, first dummy gate structure 201 and second dummy gate structure 301 are removed to form a first trench 203 and a second trench 303, as shown in FIG. 2C-1 to FIG. 2C-3 in accordance with some embodiments.

Dummy gate electrode layer 205 may be removed by a first etching process, and dummy gate dielectric layer 203 may be removed by a second etching process after the first etching process is performed. After dummy gate electrode layer 205 and dummy gate dielectric layer 203 are removed, first metal gate structure 202 is formed in first trench 203 and second metal gate structure 302 are formed in second trenches 303, as shown in FIG. 2D-1 to FIG. 2D-3 in accordance with some embodiments.

In some embodiments, first gate structure 202 and second gate structure 302 respectively include a high-k dielectric layer 109, a work function metal layer 111, and a metal gate electrode layer 113. In some embodiments, high-k dielectric layer 109 is made of high k dielectric materials such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 111 is formed over high-k dielectric layer 109 in accordance with some embodiments. Work function metal layer 111 is tuned to have a proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

Metal gate electrode layer 113 is formed over work function metal layer 111 in accordance with some embodiments. In some embodiments, metal gate electrode layer 113 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. High-k dielectric layer 109, work function metal layer 111, and metal gate electrode layer 113 may be formed by any applicable processes to any applicable thicknesses.

It should be noted that additional layers may be formed above and/or below high-k dielectric layer 109, work function metal layer 111, and metal gate electrode layer 113, such as liner layers, interface layers, seed layers, adhesion layers, barrier layers, or the like. In addition, high-k dielectric layer 109, work function metal layer 111, and metal gate electrode layer 113 may include one or more materials and/or one or more layers.

An upper portion of first gate structure 202 and second gate structure 302 are removed from upper portions of first trench 203 and second trench 303 by an etching process, as shown in FIG. 2E-1 to FIG. 2E-3. After the etching process, a top surface of work function metal layer 111 is lower than a top surface of metal gate electrode layer 113 in accordance with some embodiments. As shown in FIG. 2E-1, metal gate electrode layer 113 of first gate structure 202 has a tipped portion extending from work function metal layer 111 of first gate structure 202. Similarly, metal gate electrode layer 113 of second gate structure 302 also has a tipped portion extending from work function metal layer 111 of second gate structure 302. The etching process may be a wet etching process or a dry etching process. It should be noted that although metal gate electrode layer 113 shown in FIG. 2E-1 to FIG. 2E-3 have the tipped portion, metal gate electrode layer 113 may have a flat top surface level with the top surface of work function metal layer 111 in some other embodiments.

Next, the upper portions of first trench 203 and second trench 303 are filled with a hard mask material to form a first hard mask structure 212 and a second hard mask structure 312, as shown in FIG. 2F-1 to FIG. 2F-3 in accordance with some embodiments. More specifically, first hard mask structure 212 is formed on first gate structure 202, and second hard mask structure 312 is formed on second gate structure 302.

As described above, first gate structure 202 and second gate structure 302 are formed by the same process, and first hard mask structure 212 and second hard mask structure 312 are also formed by the same process. Therefore, first hard mask structure 212 has a first thickness $T_1$ and second hard mask structure 312 has a second thickness $T_2$ substantially equal to first thickness $T_1$ in accordance with some embodiments. In some embodiments, first thickness $T_1$ is in a range from about 10 nm to about 50 nm. In addition, a width of first hard mask structure 212 is substantially equal to a width of second hard mask structure 312 in accordance with some embodiments. In some embodiments, a width of first gate structure 202 is substantially equal to a width of second gate structure 302. In some embodiments, the width of first gate structure 202 is in a range from about 10 nm to about 300 nm.

Next, a dielectric layer 115 is formed on inter-layer dielectric layer 107, first gate structure 202, and second gate structure 302, as shown in FIG. 2G-1 to FIG. 2G-3 in accordance with some embodiments. In some embodiments, dielectric layer 115 is made of silicon oxide, silicon nitride, silicon oxynitride, or other applicable dielectric materials similar to, or the same as, inter-layer dielectric layer 107. Dielectric layer 115 may be formed by a CVD process.

Afterwards, a photoresist layer 117 is formed over dielectric layer 115, as shown in FIG. 2G-1 to FIG. 2G-3 in accordance with some embodiments. Photoresist layer 117 has a first opening 214 and a second opening 314. First opening 214 is positioned over first gate structure 202, and second opening 314 is positioned over source and drain regions 108 adjacent to second gate structure 302.

Next, a first etching process is performed to etch a portion of dielectric layer 115 over first hard mask structure 212 to form a first conductive structure trench 216, as shown in FIG. 2H-1 to FIG. 2H-3 in accordance with some embodiments. In addition, another portion of dielectric layer 115 and a portion of inter-layer dielectric layer 107 are also etched during the first etching process to form a second contact trench 316 in accordance with some embodiments. In some embodiments, the first etching process includes using an etchant which can selectively etch dielectric layer 115 and inter-layer dielectric layer 107 while first hard mask structure 202 will not be etched by the etchant. In some embodiments, the first etching process is a wet etching process.

After first conductive structure trench 216 and second contact trench 316 are formed, first conductive structure trench 216 and second contact trench 316 are filled with a first conductive material to form first conductive structure 204 and second contact 306 respectively, as shown in FIGS. 2I-1 to FIG. 2I-3 in accordance with some embodiments. More specifically, first conductive structure 204 is formed on first hard mask structure 212 over first portion 210 of first gate structure 202, and second contact 306 is formed on strained source and drain structure 108 of fin structure 104 adjacent to second gate structure 302. As described above, since dielectric layer 115 is etched but first hard mask structure 212 is not etched during the first etching process, first conductive structure 204 and first gate structure 202 are separated by first hard mask structure 212.

In some embodiments, first conductive structure 204 has a first conductive structure width $W_1$ and second contact 306 has a second contact width $W_3$ substantially equal to first conductive structure width $W_1$. In some embodiments, first conductive structure width $W_1$ is in a range from about 30 nm to about 60 nm.

In some embodiments, the first conductive material used to made first conductive structure 204 and second contact 306 includes aluminum (Al), copper (Cu), tungsten (W), titanium (Ti), tantalum (Ta), titanium nitride (TiN), tantalum nitride (TaN), nickel silicide (NiS), cobalt silicide (CoSi), tantulum carbide (TaC), tantalum silicide nitride (TaSiN), tantalum carbide nitride (TaCN), titanium aluminide (TiAl), titanium aluminide nitride (TiAlN), other applicable conductive materials, or a combination thereof.

After first conductive structure 204 and second contact 306 are formed, a second etching process is performed to etch a portion of dielectric layer 115 over second portion 211 of first gate structure 202 until a top surface of first gate structure 202 is exposed, as shown in FIG. 2J-1 to FIG. 2J-3 in accordance with some embodiments. A first contact trench 218 is formed on second portion 211 (as shown in FIG. 1) of first gate structure 202.

In some embodiments, the second etching process includes using an etchant which can etch dielectric layer 115, inter-layer dielectric layer 107, and first hard mask structure 202. Therefore, the etchant used in the second etching process may be different from the etchant used in the first etching process. In some embodiments, the second etching process is a wet etching process.

Next, first contact trench 218 is filled with a second conductive material to form first contact 206, as shown in FIG. 2K-1 to FIG. 2K-3 in accordance with some embodiments. As described above, since first hard mask structure 202 is etched during the second etching process, first contact 206 is in direct contact with first gate structure 202.

In some embodiments, first contact 206 has a first contact width $W_2$ in a range from about 30 nm to about 150 nm. In some embodiments, a ratio of first conductive structure width $W_1$ to first contact width $W_2$ is in a range from about 1:1 to about 1:3. If the ratio of first conductive structure width $W_1$ to first contact width $W_2$ is too large, first hard mask structure 212 may be etched through due to the process loading effect, and first conductive structure 204 may bridge first gate structure 202. In addition, inter-layer dielectric layer 107 may also be etched out too much and increase extra capacitance. If the ratio of first conductive structure width $W_1$ to first contact width $W_2$ is too small, the trench depth of first conductive structure 204 may be too shallow and capacitance is reduced.

In some embodiments, the second conductive material used to make first contact 206 is the same as the first conductive material. Examples of the second conductive material include, but are not limited to, aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantulum silicide nitride (TaSiN), tantalum carbide nitride (TaCN), titanium aluminide (TiAl), titanium aluminide nitride (TiAlN), other applicable conductive materials, or a combination thereof.

FIG. 3 is a perspective view of semiconductor structure 100 shown in FIG. 1 and FIG. 2A-1 to FIG. 2K-3 in accordance with some embodiments. As shown in FIG. 3, first capacitor structure 200 includes first gate structure 202 formed over substrate 102, and first portion 210 (shown in FIG. 1) of first gate structure 202 overlaps with a portion of fin structure 104. In addition, first hard mask structure 212 is formed over first portion 210 of first gate structure 202, and first conductive structure 204 is formed on first hard mask structure 212 over first portion 210 of first gate structure 202. Furthermore, first contact 206 is formed on second portion 211 of first gate structure 202. That is, first contact 206 does not form on first hard mask structure 212 but form through first hard mask structure 212 in accordance with some embodiments.

As shown in FIG. 3, since first conductive structure 204 and first gate structure 202 are separated by first hard mask structure 212 while first contact 206 is in direct contact with second portion 211 of first gate structure 202, a bottom surface of first conductive structure 204 is not level with the bottom surface of first contact 206.

In addition, since first conductive structure 204 is formed on first hard mask structure 212 without further etching first hard mask structure 212, first thickness $T_1$ of first hard mask structure 212 is substantially equal to second thickness $T_2$ of second hard mask structure 312. Therefore, second thickness $T_2$ of second hard mask structure 312 can be monitores by measuring the capacitance-equivalent thickness (CET) of first hard mask structure 212 of first capacitor 200. In some embodiments, the capacitance-equivalent thickness is measured by a wafer acceptance test.

Second hard mask structure 312 is configured to prevent circuit shortage between second contact 306 and second gate structure 302. However, it is difficult to measure the thickness of second hard mask structure 312. Therefore, first conductive structure 204 is formed on first hard mask structure 212, which has the same thickness as that of second hard mask structure 312, and the thickness of first hard mask structure 212 can be measured by measuring the capacitance-equivalent thickness (CET) of first hard mask structure 212 of first capacitor 200. Accordingly, the thickness of second hard mask structure 312 can be monitored and the rick of circuit shortage between second contact 306 and second gate structure 302 can be decreased.

Figures 1, 4A:
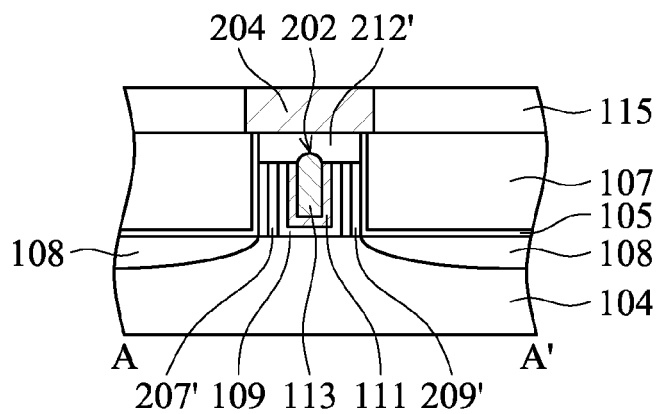
Figures 2, 4A:
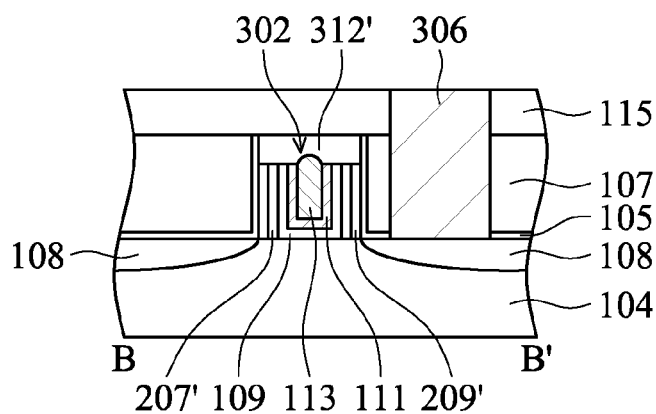
Figures 3, 4A:
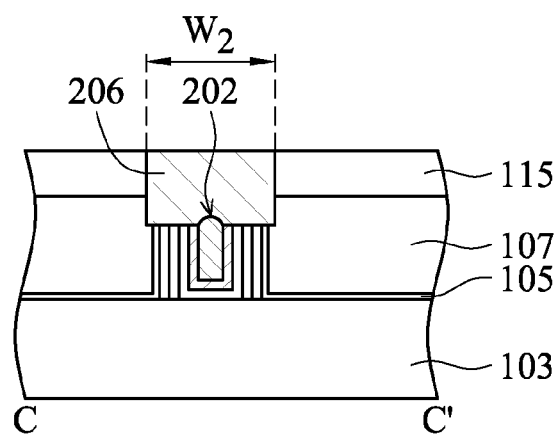
Figure 4B:
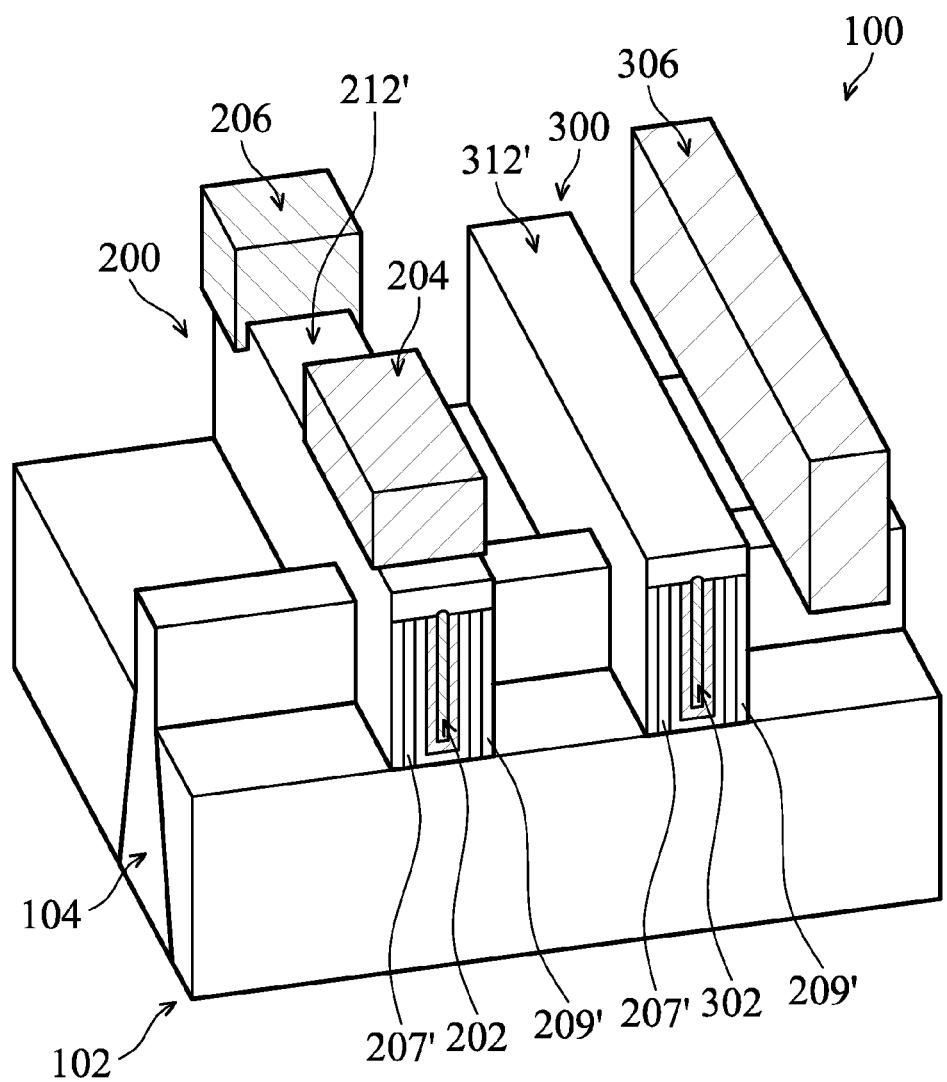
FIG. 4B a perspective view of the semiconductor structure shown in FIG. 1 and FIG. 4A-1 to FIG. 4A-3 in accordance with some embodiments.

FIG. 4A-1 to FIG. 4A-3 are cross-sectional representations of semiconductor structure 100 taken along lines A-A', B-B', and C-C' shown in FIG. 1 in accordance with some other embodiments. FIG. 4B a perspective view of semiconductor structure 100 shown in FIG. 1 and FIG. 4A-1 to FIG. 4A-3 in accordance with some embodiments.

Formation for forming the structures shown in FIG. 4A-1 to FIG. 4A-3 are similar to those shown in FIG. 2A-1 to FIG. 2K-3, except during the etching process performed in FIG. 2E-1 to FIG. 2E-3, an upper portion of seal layer 207' and spacer 209' are also removed in accordance with some embodiments. Accordingly, a first hard mask structure 212' is formed on first gate structure 202, seal layer 207', and spacer 209'. Similarly, a second hard mask structure 312' is formed on second gate structure 302, seal layer 207', and spacer 209'. Other processes and materials used to form the structure shown in FIG. 4A-1 to FIG. 4A-3 are similar to, or the same as, those in FIG. 2A-1 to FIG. 2K-3 and therefore are not repeated herein.

Figure 5A:
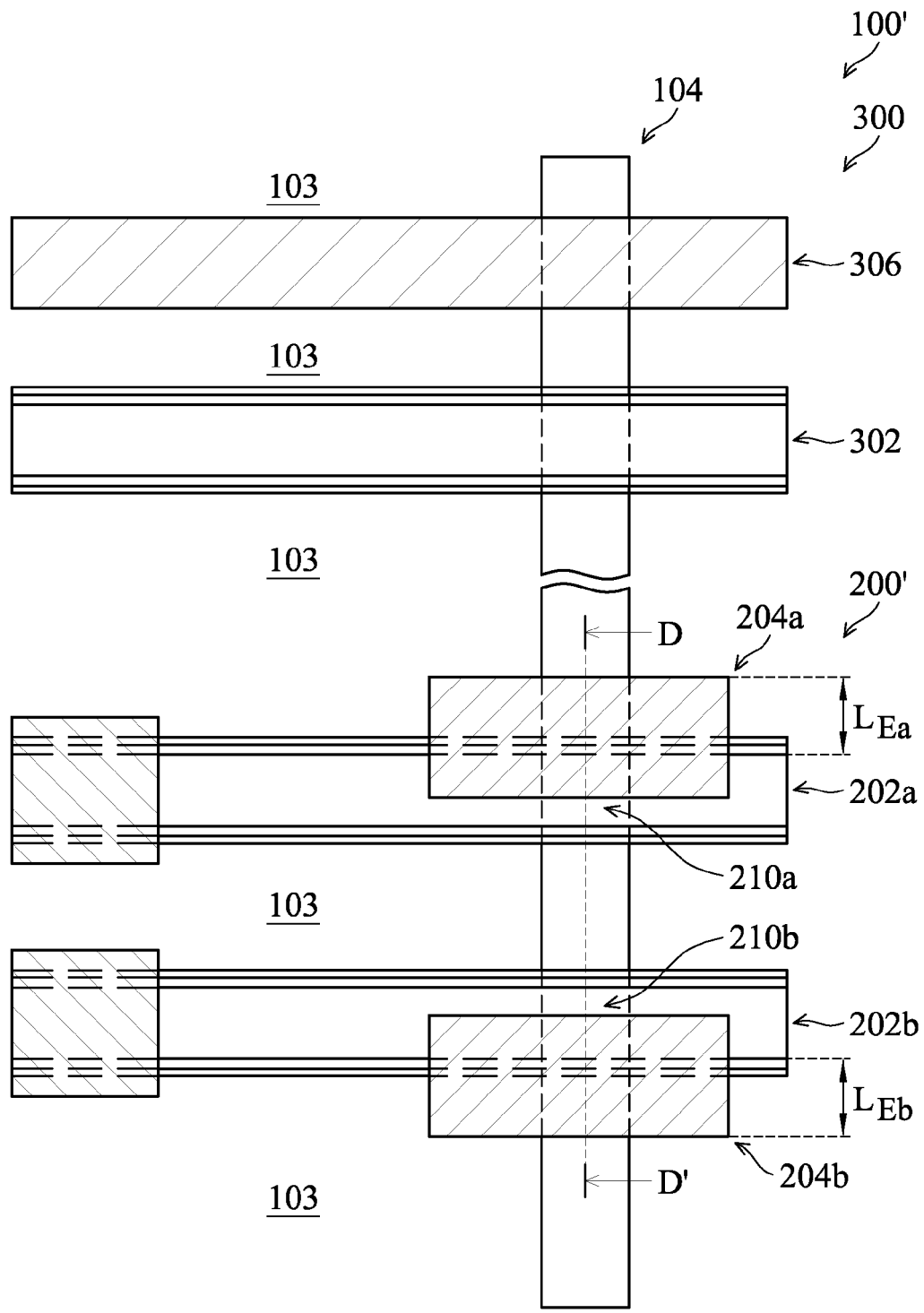
FIG. 5A is a top view representation of a semiconductor structure in accordance with some embodiments.
Figure 5B:
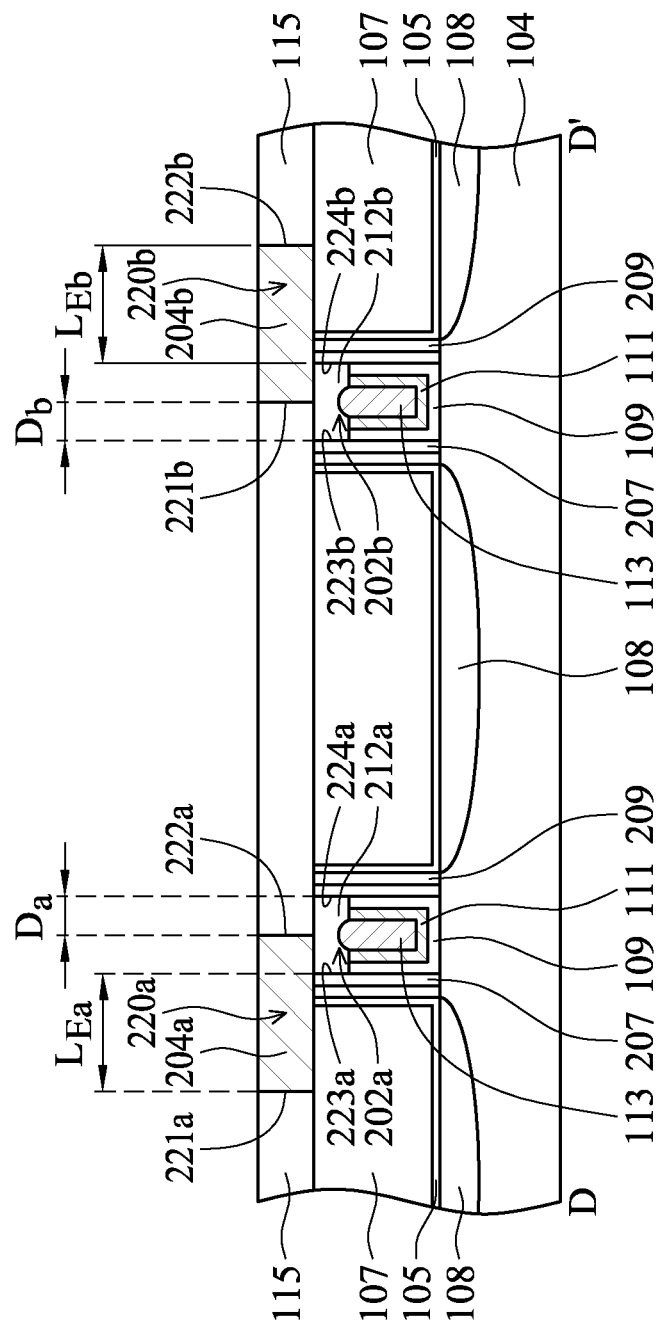
FIG. 5B is a cross-sectional representation of the semiconductor structure taken along line D-D' shown in FIG. 5A in accordance with some embodiments.

FIG. 5A is a top view representation of a semiconductor structure 100' in accordance with some embodiments. FIG. 5B is a cross-sectional representation of semiconductor structure 100' taken along line D-D' shown in FIG. 5A in accordance with some embodiments.

As shown in FIG. 5A, semiconductor structure 100' includes transistor structure 300, a second capacitor structure 200a, and a third capacitor structure 200b in accordance with some embodiments. The structure and materials for forming transistor structure 300 shown in FIG. 5A are similar to or the same as those for forming transistor structure 300 shown in FIG. 1. Therefore, the details related to transistor structure 300 are not repeated herein.

Similarly, the structure and materials for forming second capacitor structure 200a and third capacitor structure 200b shown in FIG. 5A are also similar to those for forming first capacitor structure 200 shown in FIG. 1, except the position of second conductive structure 202a and third conductive structure 202b are shifted. Therefore, portions similar to those shown in FIG. 1, such as high-k dielectric layer 109, work function metal layer 111, metal gate electrode layer 113, sealing layer 207, and spacers 209, are not repeated herein.

Second capacitor structure 200a includes a third gate structure 202a, a third hard mask structure 212a formed over a first portion 210a of third gate structure 202a, and a third conductive structure 204a formed over third hard mask structure 212a over first portion 210a of third gate structure 202a.

As shown in FIG. 5B, third conductive structure 204a has a first sidewall 221a and a second sidewall 222a. In some embodiments, third conductive structure 204a has a third extending portion 220a extending from a first sidewall 223a of third hard mask structure 212a, while a second sidewall 224a of third hard mask structure 212a is not overlapped by third conductive structure 204a.

As shown in FIG. 5B, third extending portion 220a has a length $L_{Ea}$, which is defined by the distance between first sidewall 221a of third conductive structure 204a and first sidewall 223a of third hard mask structure 212a. In some embodiments, length $L_{Ea}$ is in a range from about 5 nm to about 35 nm. In some embodiments, a distance $D_a$ between second sidewall 222a of third conductive structure 204a and second sidewall 224a of third hard mask structure 212a is in a range from about 5 nm to about 25 nm.

Third capacitor structure 200b includes a fourth gate structure 202b, a fourth hard mask structure 212b formed over a first portion 210b of fourth gate structure 202b, and a fourth conductive structure 204b formed over fourth hard mask structure 212b over first portion 210b of fourth gate structure 202b.

As shown in FIG. 5B, fourth conductive structure 204b has a first sidewall 221b and a second sidewall 222b. In some embodiments, fourth conductive structure 204b has a fourth extending portion 220b extending from a second sidewall 224b of fourth hard mask structure 212b, while a first sidewall 223a of fourth hard mask structure 212b is not overlapped by fourth conductive structure 204a.

As shown in FIG. 5B, fourth extending portion 220a has a length $L_{Eb}$, which is defined by the distance between second sidewall 222b of fourth conductive structure 204b and second sidewall 224b of fourth hard mask structure 212b. In some embodiments, length $L_{Eb}$ is in a range from about 5 nm to about 35 nm. In some embodiments, a distance $D_b$ between first sidewall 221b of fourth conductive structure 204a and first sidewall 223b of fourth hard mask structure 212b is in a range from about 5 nm to about 25 nm.

As shown in FIG. 5B, the position of each conductive structure is shifted relative to the gate structure below. The position shifting of the conductive structures is configured to compensate for inaccuracy when measuring the capacitance-equivalent thickness (CET) of the structure due to layout shifting. More specifically, by shifting the position of the conductive structures above the gate structures, the total CET effective area can be corrected because of the compensation from the opposite direction. Therefore, even if the layout of the gate structures are shifted and the conductive structures are not accurately aligned with the gate structures, the total CET effective area can still be accurate.

In some embodiments, length $L_{Ea}$ of third extending portion 220a is the same as length $L_{Eb}$ of fourth extending portion 220b. However, third extending portion 220a extends from the side of third hard mask structure 212a away from fourth hard mask structure 212b. In addition, fourth extending portion 220b extends from the side of fourth hard mask structure 212b away from third hard mask structure 212a. Therefore, the total CET effective area can be corrected because of the compensation from the opposite direction.

It should be noted that although the position of third conductive structure 204a and fourth conductive structure 204b are shifted relative to the gate structures 202a and 202b respectively, the position of first contacts 206 are not changed, as shown in FIG. 5A in accordance with some embodiments.

It should be noted that although the first conductive structures shown in FIG. 1 to FIG. 5B are formed overlapping with fin structure 104, they are merely examples for better understanding the disclosure. That is, the first conductive structures may be formed over the hard mask structure over the gate structures without overlapping with fin structure 104 in some other embodiments, and the scope of the disclosure is not intended to be limiting.

As described previously, a conductive structure (e.g. first conductive structures 204) is formed on a hard mask structure (e.g. first hard mask structure 212) over a gate structure (e.g. first gate structure 202) and the structure can be considered as a capacitor structure. In addition, as shown in FIG. 2A-1 to FIG. 2F-3, first gate structure 202 and second gate structure 302 are formed by the same process, and first hard mask structure 212 and second hard mask structure 312 are formed by the same process. Therefore, first gate structure 202 is the same as second gate structure 302, and first hard mask structure 212 is the same as second hard mask structure 312 in accordance with some embodiments. Furthermore, as shown in FIG. 2G-1 to FIG. 2I-3, the formation of first conductive structure 204 and second contact 306 are almost the same except the position of first opening 214 and second position 314 are different. More specifically, first opening 214 is positioned above first gate structure 202 instead of above source and drain regions 108. That is, the formation of capacitor 200 can be complementary to the process for forming a transistor structure without additional complicated processes.

In addition, first conductive structure 204 formed on first hard mask structure 212 has the same thickness as that of second hard mask structure 312, and the thickness of first hard mask structure 212 can be measured by measuring the capacitance-equivalent thickness (CET) of first hard mask structure 212 of first capacitor structure 200. Accordingly, the thickness of second hard mask structure 312 can be monitored through first capacitor structure 200 and the rick of circuit shortage between second contact 306 and second gate structure 302 can be decreased.

Embodiments for forming a semiconductor structure are provided. The semiconductor structure includes a capacitor having a gate structure and a hard mask structure formed over the gate structure. A conductive structure is formed over the hard mask structure and is separated from the gate structure by the hard mask structure. A contact is formed on the gate structure and is in direct contact with the gate structure. The formation of the capacitor can be implemented by a process used to form a transistor structure with additional complicated processes.

In some embodiments, a semiconductor structure is provided. The semiconductor structure includes a first capacitor structure. The first capacitor structure includes a fin structure formed over a substrate and a first gate structure formed over the substrate. In addition, a first portion of the first gate structure overlaps with a portion of the fin structure. The first capacitor structure further includes a first hard mask structure formed over the first portion of the first gate structure and a first conductive structure formed on the first hard mask structure over the first portion of the first gate structure. The first capacitor structure further includes a first contact formed on a second portion of the first gate structure. In addition, the first contact is in direct contact with the second portion of the first gate structure.

In some embodiments, a semiconductor structure is provided. The semiconductor structure includes a first capacitor structure. The first capacitor structure includes a first gate structure formed over a substrate and a first hard mask structure formed over a first portion of the first gate structure. The first capacitor structure further includes a first conductive structure formed on the first hard mask structure over the first portion of the first gate structure and a first contact formed on a second portion of the first gate structure. In addition, the first contact is in direct contact with the second portion of the first gate structure. The semiconductor structure further includes a transistor structure. The transistor structure includes a second gate structure formed over the substrate and a second hard mask structure formed over a first portion of the second gate structure. The transistor structure further includes a second contact formed on source and drain regions in the substrate adjacent to the second gate structure and the first hard mask structure has a first thickness, and the second hard mask structure has a second thickness substantially equal to the first thickness.

In some embodiments, a method for forming a semiconductor structure is provided. The method for forming a semiconductor structure includes forming a first gate structure and a second gate structure over a substrate and forming first source and drain regions and second source and drain regions in the substrate respectively adjacent to the first gate structure and the second gate structure. The method for forming a semiconductor structure further includes forming a first hard mask structure on the first gate structure and a second hard mask structure on the second gate structure and forming a first conductive structure on the first hard mask structure and a second contact on the second source and drain regions adjacent to the second gate structure. The method for forming a semiconductor structure further includes forming a first contact through the first hard mask structure over the first gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first capacitor structure, the first capacitor structure comprising:
      a fin structure formed over a substrate;
      a first gate structure formed over the substrate, wherein a first portion of the first gate structure overlaps with a portion of the fin structure;
      a first hard mask structure formed over the first portion of the first gate structure;
      a first conductive structure formed on the first hard mask structure over the first portion of the first gate structure, wherein the first hard mask structure is vertically sandwiched between the first conductive structure and the first gate structure; and
      a first contact formed on a second portion of the first gate structure, wherein the first contact is in direct contact with the second portion of the first gate structure.

2. The semiconductor structure as claimed in claim 1, wherein the first portion of the first gate structure is positioned between source and drain regions of the fin structure.

3. The semiconductor structure as claimed in claim 1, wherein the first conductive structure has a first conductive structure width and the first contact has a first contact width, and a ratio of the first conductive structure width to the first contact width is in a range from about 1:1 to about 1:3.

4. The semiconductor structure as claimed in claim 1, further comprising:
   a transistor structure, the transistor structure comprising:
      a second gate structure formed over the substrate, wherein a first portion of the second gate structure overlaps with a portion of the fin structure;

a second hard mask structure formed over the first portion of the second gate structure;

a second contact formed on source and drain regions of the fin structure adjacent to the second gate structure, wherein the first hard mask structure has a first thickness, and the second hard mask structure has a second thickness substantially equal to the first thickness.

5. The semiconductor structure as claimed in claim 4, wherein the first conductive structure is configured to measure the second thickness of the second hard mask structure through measuring the capacitance-equivalent thickness of the first capacitor.

6. The semiconductor structure as claimed in claim 1, further comprising:

a second capacitor structure, the second capacitor structure comprising:

a third gate structure formed on the substrate, wherein a first portion of the third gate structure overlaps with a portion of the fin structure;

a third hard mask structure formed over the first portion of the third gate structure;

a third conductive structure formed on the third hard mask structure over the first portion of the first gate structure; and a third contact formed on a second portion of the third gate structure, wherein the third contact is in direct contact with the second portion of the third gate structure.

7. The semiconductor structure as claimed in claim 6, wherein the first conductive structure has a first extending portion extending from the first hard mask structure, and the third conductive structure has a third extending portion extending from the third hard mask structure.

8. The semiconductor structure as claimed in claim 7, wherein the first conductive structure has a first conductive structure width, and the third conductive structure has a third conductive structure width substantially equal to the first conductive structure width.

9. The semiconductor structure as claimed in claim 7, wherein the first extending portion extends from a side of the first hard mask structure away from the third hard mask structure, and the third extending portion extends from a side of the third hard mask structure away from the first hard mask structure.

10. A semiconductor structure, comprising:

a first capacitor structure, the first capacitor structure comprising:

a first gate structure formed over a substrate;

a first hard mask structure formed over a first portion of the first gate structure;

a first conductive structure formed on the first hard mask structure over the first portion of the first gate structure, wherein the first hard mask structure is vertically sandwiched between the first conductive structure and the first gate structure; and a first contact formed on a second portion of the first gate structure, wherein the first contact is in direct contact with the second portion of the first gate structure; and a transistor structure, the transistor structure comprising:

a second gate structure formed over the substrate;

a second hard mask structure formed over a first portion of the second gate structure;

a second contact formed on source and drain regions in the substrate adjacent to the second gate structure, wherein the first hard mask structure has a first thickness, and the second hard mask structure has a second thickness substantially equal to the first thickness.

11. The semiconductor structure as claimed in claim 10, wherein the transistor structure is a fin field effect transistor (finFET) structure comprising a fin structure, and the first portion of the first gate structure overlaps with a portion of the fin structure.

12. The semiconductor structure as claimed in claim 10, wherein the first conductive structure has a first conductive structure width and the first contact has a first contact width, and a ratio of the first conductive structure width to the first contact width is in a range from about 1:1 to about 1:3.

13. The semiconductor structure as claimed in claim 10, further comprising:

a second capacitor structure, the second capacitor structure comprising:

a third gate structure formed over the substrate;

a third hard mask structure formed over a first portion of the third gate structure;

a third conductive structure formed on the third hard mask structure over the first portion of the first gate structure; and a third contact formed on a second portion of the third gate structure, wherein the third contact is in direct contact with the second portion of the third gate structure.

14. The semiconductor structure as claimed in claim 13, wherein the first conductive structure has a first extending portion extending from the first hard mask structure, and the third conductive structure has a third extending portion extending from the third hard mask structure.

15. A method for forming a semiconductor structure, comprising:

forming a first gate structure and a second gate structure over a substrate;

forming first source and drain regions and second source and drain regions in the substrate respectively adjacent to the first gate structure and the second gate structure;

forming a first hard mask structure on the first gate structure and a second hard mask structure on the second gate structure;

forming a first conductive structure on the first hard mask structure and a second contact on the second source and drain regions adjacent to the second gate structure, wherein the first hard mask structure is vertically sandwiched between the first conductive structure and the first gate structure; and forming a first contact through the first hard mask structure over the first gate structure.

16. The method for forming a semiconductor structure as claimed in claim 15, wherein the first hard mask structure has a first thickness, and the second hard mask structure has a second thickness substantially equal to the first thickness.

17. The method for forming a semiconductor structure as claimed in claim 15, wherein the substrate comprises a fin structure, and a portion of the first gate structure and a portion of the second gate structure are formed over portions of the fin structure.

18. The method for forming a semiconductor structure as claimed in claim 15, wherein the step of forming a first conductive structure on the first hard mask structure and a second contact on the second source and drain regions comprises:

forming a dielectric layer over the first hard mask structure, the second hard mask structure, and the second source and drain regions;

etching the dielectric layer to form a first conductive structure trench over the first hard mask structure and a second contact trench over the second source and drain regions by a first etching process; and filling the first conductive structure trench and the second contact trench by a first conductive material to form a first conductive structure on the first hard mask structure and the second contact on the second source and drain regions.

19. The method for forming a semiconductor structure as claimed in claim 15, wherein the first conductive structure has a first conductive structure width and the first contact has a first contact width, and a ratio of the first conductive structure width to the first contact width is in a range from about 1:1 to about 1:3.

20. The method for forming a semiconductor structure as claimed in claim 15, further comprising:

forming a third gate structure over the substrate;

forming third source and drain regions in the substrate adjacent to the third dummy gate structure;

forming a third hard mask structure on the third gate structure; and forming a third conductive structure over the third hard mask structure, wherein the first conductive structure has a first extending portion extending from the first hard mask structure, and the third conductive structure has a third extending portion extending from the third hard mask structure.

* * * * *